United States Patent
Coteus et al.

(10) Patent No.: US 9,053,811 B2
(45) Date of Patent: Jun. 9, 2015

(54) MEMORY DEVICE REFRESH

(75) Inventors: Paul W. Coteus, Yorktown, NY (US);
Douglas J. Joseph, Southbury, NY (US);
Kyu-hyoun Kim, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 13/609,655

(22) Filed: Sep. 11, 2012

(65) Prior Publication Data
US 2014/0071778 A1   Mar. 13, 2014

(51) Int. Cl.
G11C 7/00    (2006.01)
G11C 11/406  (2006.01)

(52) U.S. Cl.
CPC ................................ G11C 11/40611 (2013.01)

(58) Field of Classification Search
USPC .......................... 365/222, 233.1, 149, 230.01
See application file for complete search history.

(56) References Cited

U.S. PATENT DOCUMENTS 7,242,631 B2 *  7/2007  Fujioka et al. ............... 365/222
7,729,192 B2    6/2010  Schoenfeld
7,961,543 B2    6/2011  Koshita
7,965,572 B2    6/2011  Uematsu et al.
2008/0025122 A1*  1/2008  Schakel et al. ............... 365/222
2010/0270997 A1  10/2010  Riedel
2011/0055671 A1   3/2011  Kim et al.
2011/0141795 A1   6/2011  Matsuzaki et al.
2011/0194367 A1   8/2011  Wong et al.
2011/0225355 A1   9/2011  Kajigaya

OTHER PUBLICATIONS

Stuecheli, et al., (Dec. 2010), Elastic Refresh: Techniques to Mitigate Refresh Penalties in High Density Memory, 2010 43rd Annual IEEE/ACM International Symposium on Microarchitecture (MICRO), 10 pages.
Disclosed anonymously, (May 2011), Method of refreshing dynamic random access memory, IP.com Prior Art Database, IP.com No. IPCOM000207336D, 5 pages.

* cited by examiner

*Primary Examiner* — Thao H Bui
(74) *Attorney, Agent, or Firm* — Cantor Colburn LLP

(57) ABSTRACT

According to one embodiment of the present invention, a method for refreshing memory includes receiving a synchronization command at a memory device. An internal refresh timer is reset within the memory device based on receiving the synchronization command. An internal refresh trigger is generated within the memory device based on the internal refresh timer reaching a predetermined value. A refresh of a memory array is performed within the memory device based on the internal refresh trigger.

19 Claims, 14 Drawing Sheets

MEMORY DEVICE REFRESH

BACKGROUND

The present invention relates generally to computer memory, and more particularly to refreshing of memory devices.

Computer systems often require a considerable amount of high speed memory, such as random access memory (RAM), to hold information, such as data and programs, when a computer is powered and operational. Memory device demands have continued to grow as computer systems have increased performance and complexity.

Dynamic memory devices typically require refreshing to retain stored data values over a period of time. Refreshing typically involves an increased current draw while refreshing is active. A single refresh operation may involve a number of memory pages per memory device, where each page includes a large number of data bits. As the number of memory devices and total number of data bits stored in dynamic memory continues to increase, the overall system impact of refresh activity may also increase.

SUMMARY

Exemplary embodiments include a method for refreshing memory. The method includes receiving a synchronization command at a memory device. An internal refresh timer is reset within the memory device based on receiving the synchronization command. An internal refresh trigger is generated within the memory device based on the internal refresh timer reaching a predetermined value. A refresh of a memory array is performed within the memory device based on the internal refresh trigger.

Additional exemplary embodiments include a memory system with a memory controller and a plurality of memory devices interfaced to the memory controller. Each of the memory devices includes a command decoder configured to receive a synchronization command. Each of the memory devices also includes an internal refresh timer configured to reset based on receiving the synchronization command and to generate an internal refresh trigger based on the internal refresh timer reaching a predetermined value. Each of the memory devices further includes a memory array configured to refresh based on the internal refresh trigger.

Further exemplary embodiments include a memory device with a command decoder configured to receive a synchronization command. The memory device includes an internal refresh timer configured to reset based on receiving the synchronization command and to generate an internal refresh trigger based on the internal refresh timer reaching a predetermined value. The memory device also includes a memory array configured to refresh based on the internal refresh trigger.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
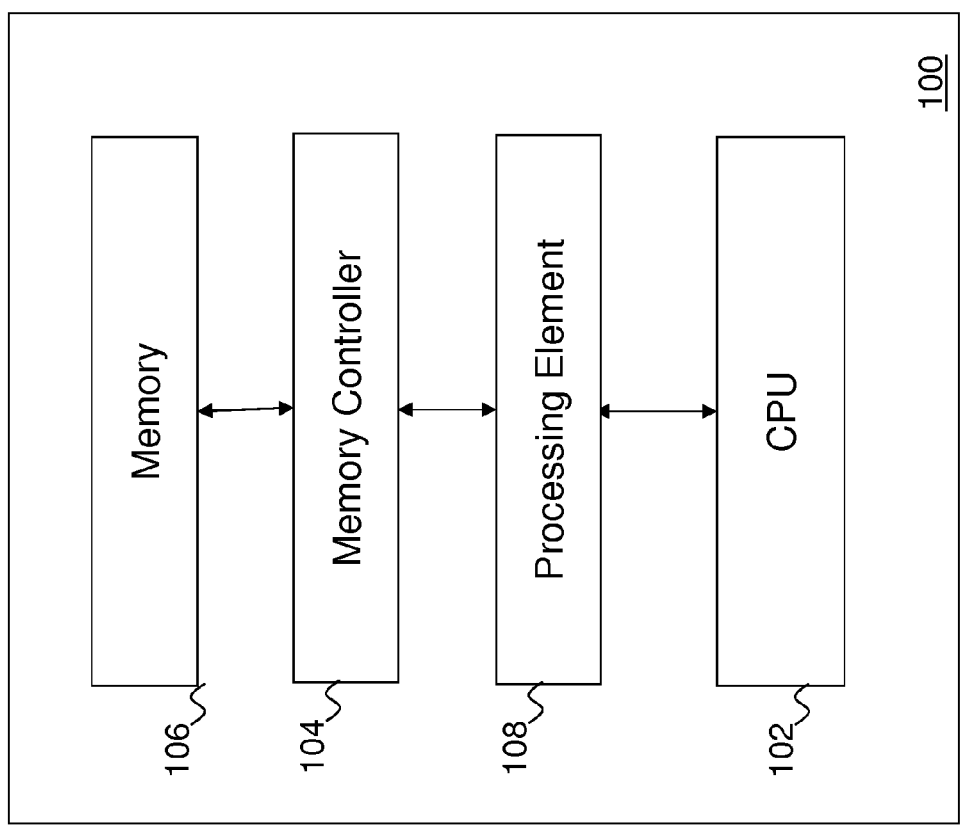
FIG. 1 illustrates a block diagram of a system for active memory in accordance with an embodiment.

An embodiment is directed to refreshing memory devices in a memory system. An example of a memory system is an active memory device that includes a plurality of memory devices (e.g., chips) connected to a logic portion and a processing element. In an embodiment, the active memory device includes layers of memory that form a three dimensional ("3D") memory device (e.g., a memory cube) where individual columns of chips form vaults in communication with the processing element and logic. The active memory device may include a plurality of processing elements configured to communicate to the chips and other processing elements. In an embodiment, a processing element accesses a selected address in a vault through an interconnect network. In addition, the interconnect network provides a communication path between processing elements and vaults on the active memory device as well as between processing elements and a main processor. Each vault may have an associated memory controller or logic unit that is also coupled to the interconnect network.

Embodiments include an active memory device that can perform a complex set of operations using multiple locations (e.g., data stored at specific addresses) within the active memory device as operands. Further, a process is provided whereby the instructions and operations are performed autonomously on these operands within the active memory device. Specifically, the instructions are stored within the active memory device itself and are not executed by a main processor. The stored instructions are provided to the processing elements for processing by the processing element in the active memory device. In one embodiment, the processing elements are programmable engines, including an instruction buffer, an instruction unit with branching capability and instruction decode, a mixture of vector, scalar, and mask register files, a plurality of load/store units for the movement of data between memory and the register files, and a plurality of execution units for the arithmetic and logical processing of various data types. Also included in the active memory device are address translation capabilities for converting virtual addresses to physical addresses, a unified Load/Store Queue to sequence data movement between the memory and the processing elements, and a processor communications unit, for communication with the main processor.

In an embodiment, the active memory device is configured to load configuration information or instructions from a part of the active memory device into a processing element following receiving a command from an external requestor, such as a main processor or another processing element. In addition, the processing element may perform virtual-to-real address translations that are computed while executing the loaded instructions. In an example, when performing a load instruction, the active memory device accesses an operand from a memory location and places the operand in a register in the processing element. A virtual address of the memory location is generated by the load instruction and is translated into a real address by the processing element. Similarly, when performing a store instruction, the active memory device writes a memory location with the contents (e.g., an operand) in a register in the processing element. A virtual address of the memory location is generated by the store instruction and is translated into a real address by the processing element.

Embodiments of the processing element in the active memory device also have the ability to read or to write operands in any part of the active memory device through the interconnect network. Specifically, a processing element may access other vaults in the active memory device using the interconnect network. In an embodiment, processing elements are pooled and coupled to the vaults via the interconnect network, where the processing elements are not physically located in the vault stack. In an embodiment, the interconnect network is a coupling device, such as a crossbar switch, configured to connect any processing element to any memory vault, provided the processing element and memory vault are coupled to the interconnect. In an embodiment, the interconnect network may couple a plurality of active memory devices, where the interconnect network provides a communication path between processing elements and memory vaults of separate devices.

In one embodiment, the processing element is included with the memory controller as part of the stack. In addition, the processing element may perform complex arithmetic and logic operations on the operands, and read and write end results back to locations in memory. The active memory device may return a single result value or signal to the main processor indicating that the results of the desired complex operation are ready in the active memory device, thus performing the high bandwidth processing on the active memory device and using a lower bandwidth communication between the active memory device and main processor.

The processing capabilities within an active memory device may reduce memory latency and energy consumption that would otherwise be experienced when memory is accessed by a processor residing in a separate chip. Instead of bringing data from memory to the separate processing chip through lower bandwidth communication paths, performing what is often quite simple calculations on the data, and then transferring the processed data back to memory, the main processor can configure the processing elements within the active memory device, and then instruct them to carry out the data processing tasks. This may be achieved by sending one or more commands from the main processor to the active memory device. In this scenario, the movement of data between the location where the data processing is performed and memory is greatly reduced, both in the distance it has to travel from the memory to the data processing location, and in the number of levels of cache traversed through a memory hierarchy.

FIG. 1 illustrates a block diagram of a system for storing and retrieving data in a memory in accordance with an embodiment. A system 100 depicted in FIG. 1 includes a computer processor (CPU) 102, a memory 106 having memory devices, as well as a memory controller 104 and processing element 108 for receiving and processing data from the computer processor 102 to be stored in the memory 106.

The memory controller 104 may be in communication with the computer processor 102 and receive write requests from the computer processor 102 without using functions of the processing element 108. The write requests contain data to be written to the memory 106 and a real address for identifying the location in the memory 106 to which the data will be written. The memory controller 104 stores data at a real address within the memory 106. The computer processor 102 can map the virtual address to a real address in the memory 106 when storing or retrieving data. The real address for a given virtual address may change each time data in the memory 106 is modified.

In an embodiment, the processing element 108 is in communication with the computer processor 102 and receives a command from the computer processor 102. The command may correspond to instructions stored in the memory 106 to perform write requests for data to be written to the memory 106. The command may also include a virtual address for identifying the location in the memory 106 to which the data will be written. The memory controller 104 and/or processing element 108 stores data at a real address within the memory 106. In an embodiment, the processing element 108 maps the virtual address to a real address in the memory 106 when storing or retrieving data. As described in further detail below, the computer processor 102 provides commands to the memory 106, where the processing element 108 receives the command and fetches corresponding instructions from the memory 106. The system 100 is one example of a configuration that may be utilized to perform the processing described herein. Although the system 100 has been depicted with only a single memory 106, memory controller 104, processing element 108 and computer processor 102, it will be understood that other embodiments would also operate in other systems with two or more of the memory 106, memory controller 104, processing element 108 or computer processor 102. In an embodiment, the memory 106, memory controller 104, processing element 108 and computer processor 102 are not located within the same computer. For example, the memory 106, processing element 108 and memory controller 104 may be located in one physical location (e.g., on a memory module) while the computer processor 102 is located in another physical location (e.g., the computer processor 102 accesses the memory controller 104 and/or processing element 108 via a network). In addition, portions of the processing described herein may span one or more of the memory 106, memory controller 104, processing element 108 and computer processor 102.

Figure 2:
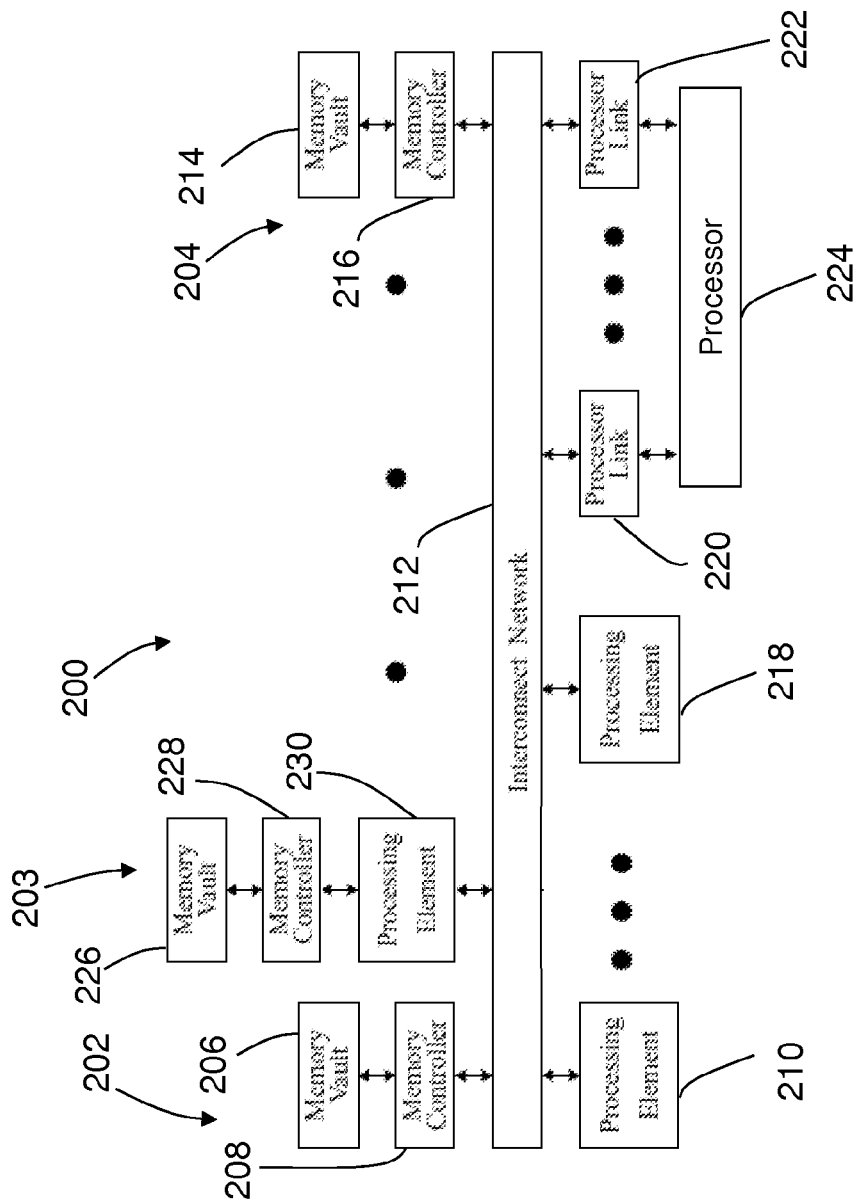
FIG. 2 illustrates a block diagram of a memory system with active memory in accordance with an embodiment.

FIG. 2 is a schematic diagram of an embodiment of a computer system 200 implementing active memory. In one embodiment, the computer system 200 includes an active memory device 202, an active memory device 203 and an active memory device 204. The active memory device 202 includes a memory vault 206, a memory controller 208 and a processing element 210. In an embodiment, the processing element 210, memory vault 206 and memory controller 208 are coupled and communicate via an interconnect network 212. Specifically, the processing element 210 communicates to the memory vault 206, memory controller 208 and other memory devices, such as active memory devices 203 and 204, via the interconnect network 212. The interconnect network 212 is also coupled to a main processor 224 by processor links 220 and 222. The interconnect network 212 provides a fast and high bandwidth path for communication between portions of the device, such processing elements, memory controllers and memory, to provide improved performance and reduced latency for the active memory.

The active memory device 203 includes a memory vault 226, a memory controller 228 and a processing element 230. In an embodiment, the processing element 230, memory vault 226 and memory controller 228 are all located on the same side of the interconnect network 212, such as within a single stack. By positioning the processing element 230 in the same stack as memory vault 226, the latency is reduced when accessing locations in the memory vault 226, thus further improving performance. In one embodiment, the active memory 204 includes a memory vault 214 and memory controller 216 coupled to processing element 210 and processing element 218 via the interconnect network 212. As depicted, the processing element 218 is located on the other side of the interconnect network 212 from the memory controller 216 and memory vault 214. In embodiments, the active memory devices 202, 203 and 204 include multiple layers of stacked addressable memory elements. Further, the stacks memory may be divided into memory vaults 206, 226 and 214, or three-dimensional blocked regions of the memory device which share a common memory controller and/or memory element, and are capable of servicing memory access requests to their domain of memory independently of one another.

In embodiments, the processing elements, memory vaults and memory controllers may be arranged in a suitable manner depending on the application. For example, one or more processing elements, such as processing element 218, may be positioned on one side of the interconnect network 212 and may operate as a pool of processing elements that are available for accessing any memory in the memory system coupled to the interconnect network 212. The pooled processing elements are not limited to accessing a particular memory vault and, thus, one or more elements may be utilized upon receiving a command from the main processor 224. Accordingly, processing element 218 may be configured to access each memory vault 206, 226 and 214. In another embodiment, one or more processing element, such as processing element 230, is located as part of a stack including a memory vault 226 and memory controller 228. In such a configuration, the processing element 230 is configured to access memory vault 226 coupled to the interconnect network 212, including memory vaults 206 and 214. In one embodiment, one or more processing element, such as processing element 210, is positioned on an opposite side of the interconnect network 212 from the memory vault 206 and memory controller 208. In the configuration, the processing element 210 is configured to access any memory coupled to the interconnect network 212, including memory vaults 226 and 214.

In an embodiment, the computer system may include a plurality of active memory devices, such as the active memory devices 202, 203 and 204. Further, each active memory device may include a plurality of stacks, each stack including a memory vault, memory controller and associated processing element. In one example, the number of processing elements may be greater than the number of memory vaults. In another embodiment, the memory devices may include fewer processing elements than memory vaults. In embodiments, the processing elements are pooled and available to access any memory in the system. For example, a memory device may include 16 memory vaults and memory controllers, but only eight processing elements. The eight processing elements are pooled, and utilized as resources for accessing any memory vaults coupled to the interconnect network. In another example, a memory device may be passive, where the device is controlled by processing elements of active memory devices coupled to the interconnect network.

Figure 3:
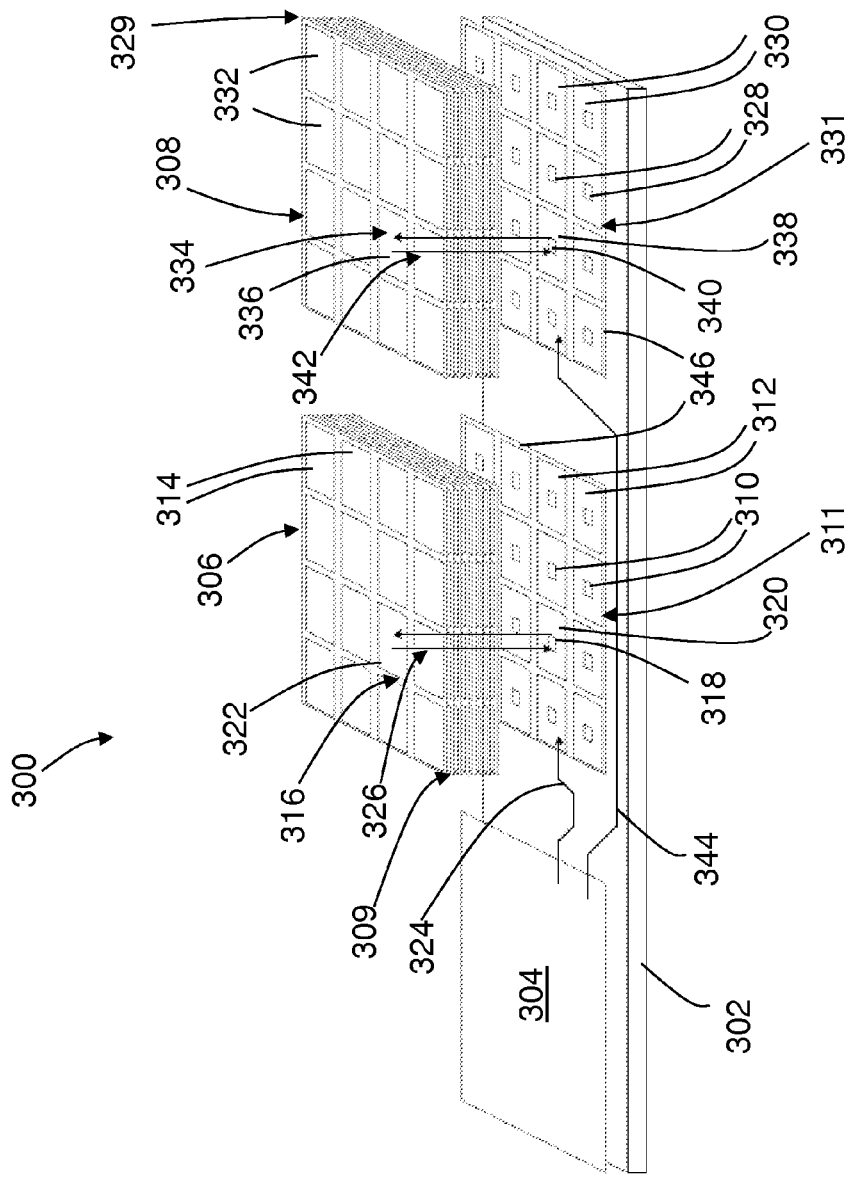
FIG. 3 illustrates a schematic diagram of a memory system with active memory in accordance with an embodiment.

FIG. 3 is a diagram of an exemplary computer system 300 implementing active memory. The computer system 300 includes a circuit board 302, a main processor 304, active memory device 306 and active memory device 308. The active memory device 306, active memory device 308 and main processor 304 are disposed on the circuit board 302. As depicted, portions of the active memory devices 306 and 308 are exploded to show details of the computer system 300 arrangement. The active memory devices 306 and 308 communicate to the main processor 304 via signal paths 324 and 344, respectively. As depicted, the active memory 306 device is arranged in layers, where a base layer 311 includes a plurality of memory controllers 310 and processing elements 312. For example, the active memory device 306 includes layers 309 of memory placed on top of the base layer 311, where the layers 309 each have a plurality of memory elements. As depicted, the base layer 311 also includes an interconnect network 346 to enable high bandwidth communication between memory, memory controllers and processing elements in the device.

In an embodiment, the active memory device 306 includes a plurality of memory vaults 314, where each memory vault 314 includes a memory element from each layer 309, the memory vaults 314 positioned adjacent to memory controllers 310 and processing elements 312. Specifically, the exemplary active memory device 306 includes layers of 16 memory elements, where the element layers form stacks, including a stack 316, where the stack 316 includes a memory vault 322 disposed above a memory controller 318 and a processing element 320. A high bandwidth communication path 326 provides a high bandwidth, direct and substantially reduced length (e.g., as compared to paths 324, 344) communication path between the processing element 320 and memory locations within the memory vault 322, thus reducing latency and power consumption for memory accesses. For example, the processing element 320 may receive a command from the main processor 304, load instructions from within the active memory device 306 based on the command, and, as part of the loaded instructions, access data at a location in the memory vault 314 and perform a complex operation on the data in the processing element 320. Further, the processing element 320 may also store data, such as the result, in the memory vault 314 and transmit a value or signal to the main processor 304 following execution of the command. In an embodiment, the processing element 320 stores or writes data (e.g. an operand) from a register in the processing element 320 to the memory vault 314. The processing element 320 is also configured to translate addresses from virtual-to-real and real-to-virtual as part of the read or store operations. Thus, the processing element 320 provides instruction loading, address translation, complex operations and other tasks local to the memory to reduce latency, save power and free up the main processor 304 to perform other tasks.

Similarly, the active memory device 308 includes a plurality of memory controllers 328 and processing elements 330 disposed on a base layer 331. In an embodiment, the active memory 308 includes layers 329 of memory devices placed on top of the base layer 331, where the layers 329 each have a plurality of memory devices. The base layer 331 also includes an interconnect network 346 to enable high bandwidth communication between memory and processing elements in the device. In an embodiment, the interconnect networks 346 of active memory device 306 and active memory device 308 are coupled and allow communication between processing elements and memory on separate devices.

In an embodiment, the active memory device 308 includes a plurality of memory vaults 332, where each memory vault 332 includes a memory element from each layer 309, the memory vaults 332 are positioned adjacent to memory controllers 328 and processing elements 330. The exemplary active memory device 308 includes 16 stacks, including stack 334, where the stack 334 includes a memory vault 336 disposed above a memory controller 340 and a processing element 338. A high bandwidth communication path 342 provides communication between the processing element 330 and memory locations within the memory vault 336.

Figure 4:
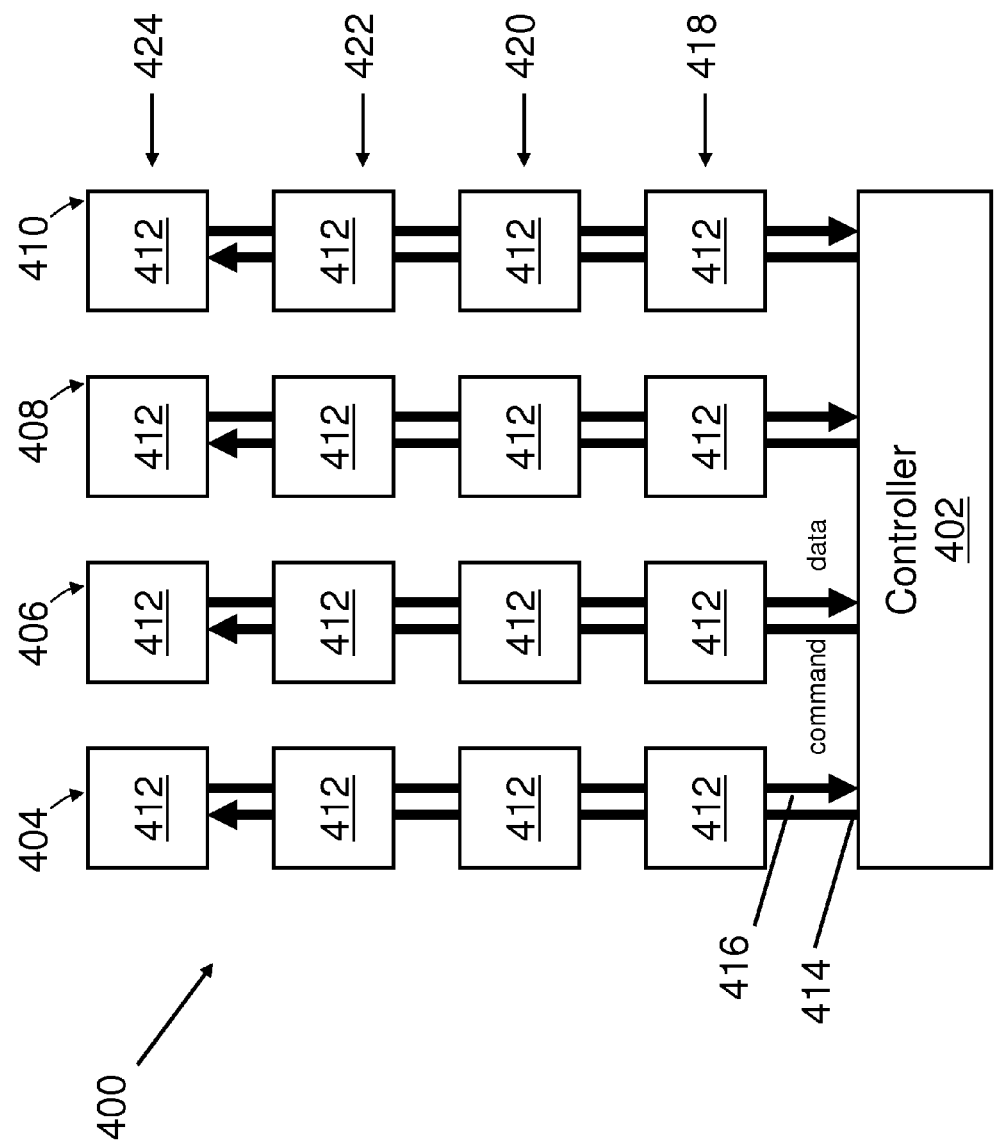
FIG. 4 illustrates another example of a memory system in accordance with an embodiment.

FIG. 4 depicts an example of a memory system 400 in accordance with an embodiment. A memory controller 402 controls read and write accesses to memory columns 404, 406, 408, and 410 of memory devices 412. A command bus 414 and a data bus 416 are configured to send and receive commands, status, and data between the memory controller 402 and the memory devices 412. Each of the memory columns 404-410 may be separate memory vaults or may collectively be a memory vault. In an embodiment, the command and data buses 414 and 416 may be configured to broadcast commands and data on a column basis, including for example, a memory device identifier to target particular memory devices 412 per column.

Alternatively, each of the memory columns 404-410 can be configured as cascade interconnected memory devices 412. For example, the memory controller 402 may only directly communicate with memory devices 412 in a first row 418 that is closest in proximity to the memory controller 402. The memory devices 412 of the first row 418 can propagate commands and data to a second row 420 of the memory devices 412 for the respective memory columns 404-410. The memory devices 412 of the second row 420 can propagate commands and data to a third row 422 of the memory devices 412 for the respective memory columns 404-410. The memory devices 412 of the third row 422 can propagate commands and data to a fourth row 424 of the memory devices 412 for the respective memory columns 404-410, and so forth.

Although the command and data buses 414 and 416 are depicted in FIG. 4 with unidirectional arrows, it will be understood that they can include any number of unidirectional and/or bidirectional signals, including status signals (not depicted). Additionally, the number of memory columns 404-410 and memory devices 412 depicted in FIG. 4 is merely for example purposes, as the memory system 400 can include any number of memory columns and memory devices 412 per memory column. The memory system 400 can be part of an active memory cube or can be organized in conventional configurations, such as a memory module or planar configuration.

Figure 5:
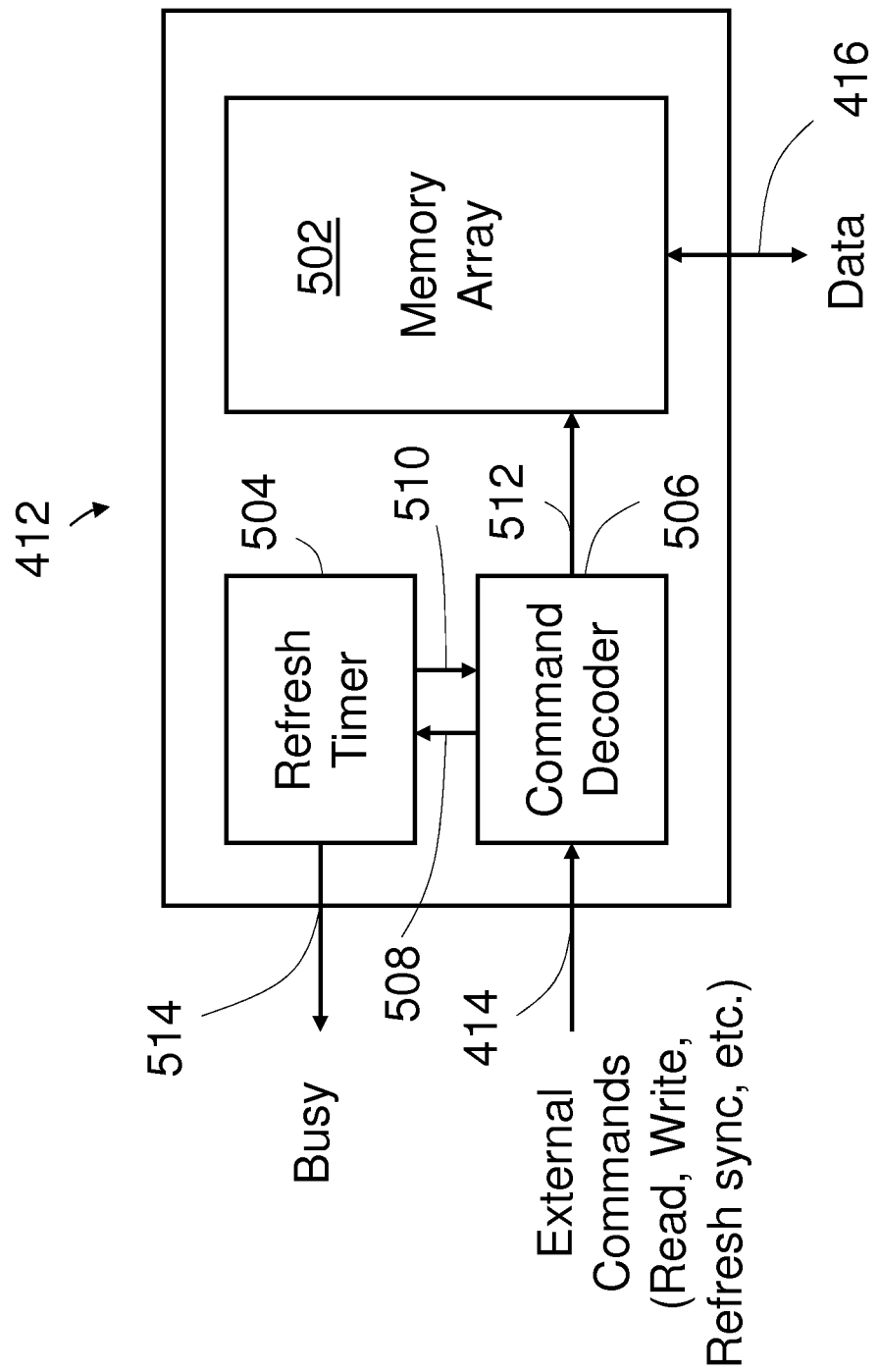
FIG. 5 illustrates a memory device in accordance with an embodiment.

FIG. 5 illustrates a memory device 412 of FIG. 4 in accordance with an embodiment. As depicted in FIG. 5, the memory device 412 can include a memory array 502 of dynamic memory cells requiring a periodic refresh. An internal refresh timer 504 within the memory device 412 interfaces with a command decoder 506. The command decoder 506 receives external commands on command bus 414, such as read, write, and refresh synchronization. When the refresh synchronization command, also referred to as the synchronization command, is received at the memory device 412, the command decoder 506 generates a timer reset 508 to reset the internal refresh timer 504. The internal refresh timer 504 generates an internal refresh trigger 510 within the memory device 412 based on the internal refresh timer 504 reaching a predetermined value. The command decoder 506 receives the internal refresh trigger 510 and performs the refresh of the memory array 502 over internal command bus 512 within the memory device 412 based on the internal refresh trigger 510.

Typically, the internal refresh timer 504 triggers internal refreshes according to a predefined period based on the predetermined value. The predetermined value can be configured based on an overall memory device refresh rate, for example, a 64-millisecond device refresh interval, divided by the number page groups per internal refresh action. Resetting the internal refresh timer 504 can extend a current refresh period by forcing the internal refresh timer 504 to reset to a count of zero and resume counting towards the predetermined value. Accordingly, the predetermined value may be configured to be a value that is about half of the maximum tolerable refresh period such that data corruption of the memory array 502 does not occur if the internal refresh timer 504 was close to the predetermined value when reset.

The memory device 412 may also output a busy signal 514 as a status signal for the memory controller 402. The busy signal 514 can be used to instruct the memory controller 402 to refrain from issuing read and write commands while the memory device 412 is refreshing. The busy signal 514 may be triggered immediately by the internal refresh timer 504 upon receiving the timer reset 508. Alternatively, the memory device 412 can include an internal command queue (not depicted) to store commands received while a refresh action is active, with the busy signal 514 output upon filling the internal command queue after the internal refresh trigger 510. When the memory device 412 is no longer busy, data can be read and written to the memory array 502 via the data bus 416 based on commands received on the command bus 414. As a further alternative, internal refreshing of the memory device 412 may be limited to a segment of the memory device 412, such that the busy signal 514 is associated with only the segment being refreshed, while segments of the memory device 412 that are not being refreshed can support read and write operations.

Figure 6:
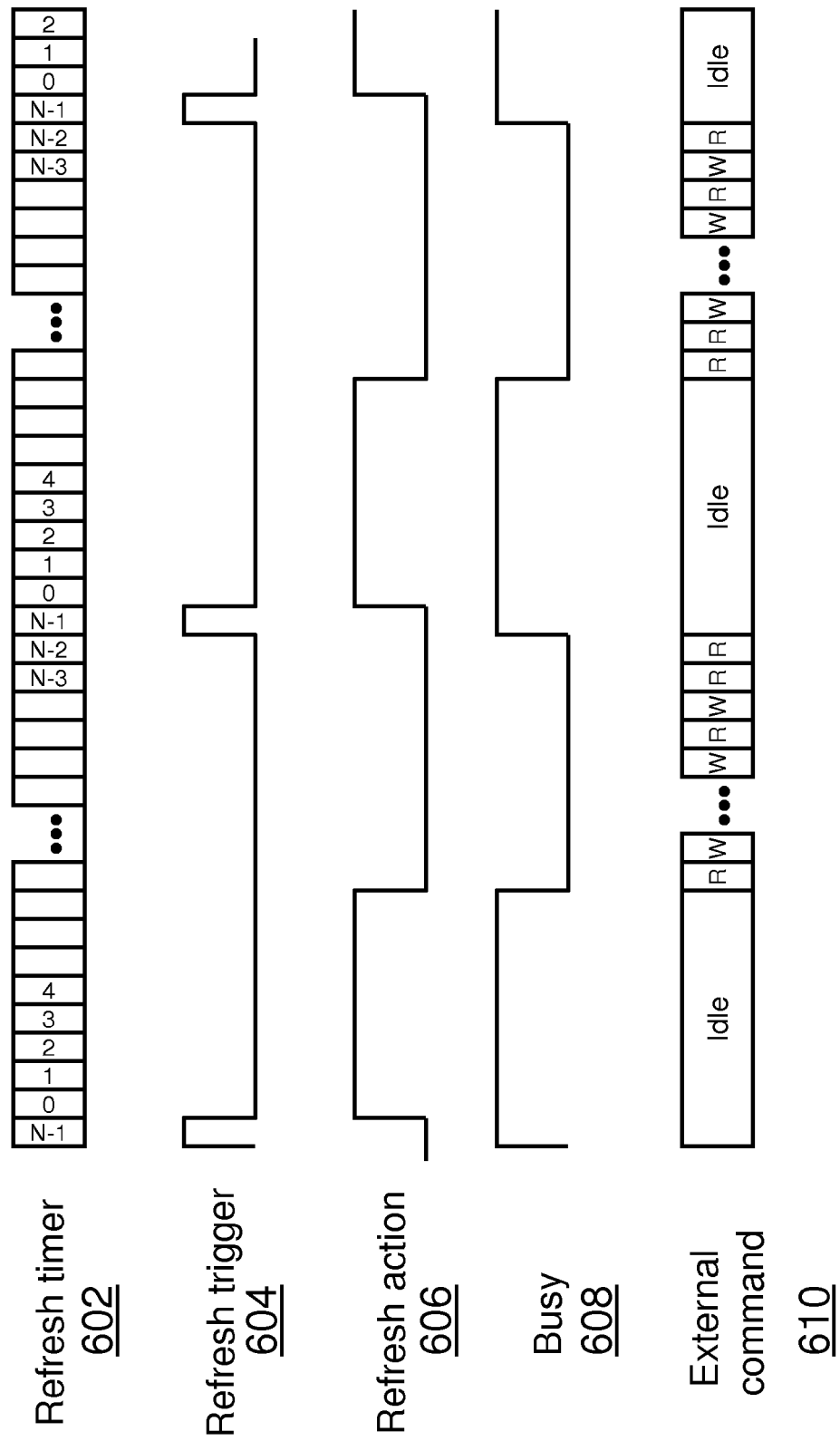
FIG. 6 illustrates an example timing diagram for the memory device of FIG. 5 when refresh synchronization is not active in accordance with an embodiment.

FIG. 6 illustrates an example timing diagram for the memory device 412 of FIG. 5 when refresh synchronization is not active in accordance with an embodiment. Example timing of the internal refresh timer 504 is depicted as refresh timer sequence 602 in FIG. 6, where the predetermined value causing a reset is N−1. Upon reaching the predetermined value, the internal refresh trigger 510 initiates a pulse in refresh trigger sequence 604. Refresh action sequence 606 is initiated by the internal refresh trigger 510 to refresh the memory array 502. A busy sequence 608 indicates that the busy signal 514 can be asserted when the internal refresh trigger 510 initiates a pulse in refresh trigger sequence 604 and the refresh action sequence 606 is active. While the busy signal 514 is asserted, as depicted in the busy sequence 608, an external command sequence 610 on the command bus 414 remains idle. When the busy signal 514 is not asserted, as depicted in the busy sequence 608, read and write commands can resume to the memory device 412 as depicted in the external command sequence 610.

Figure 7:
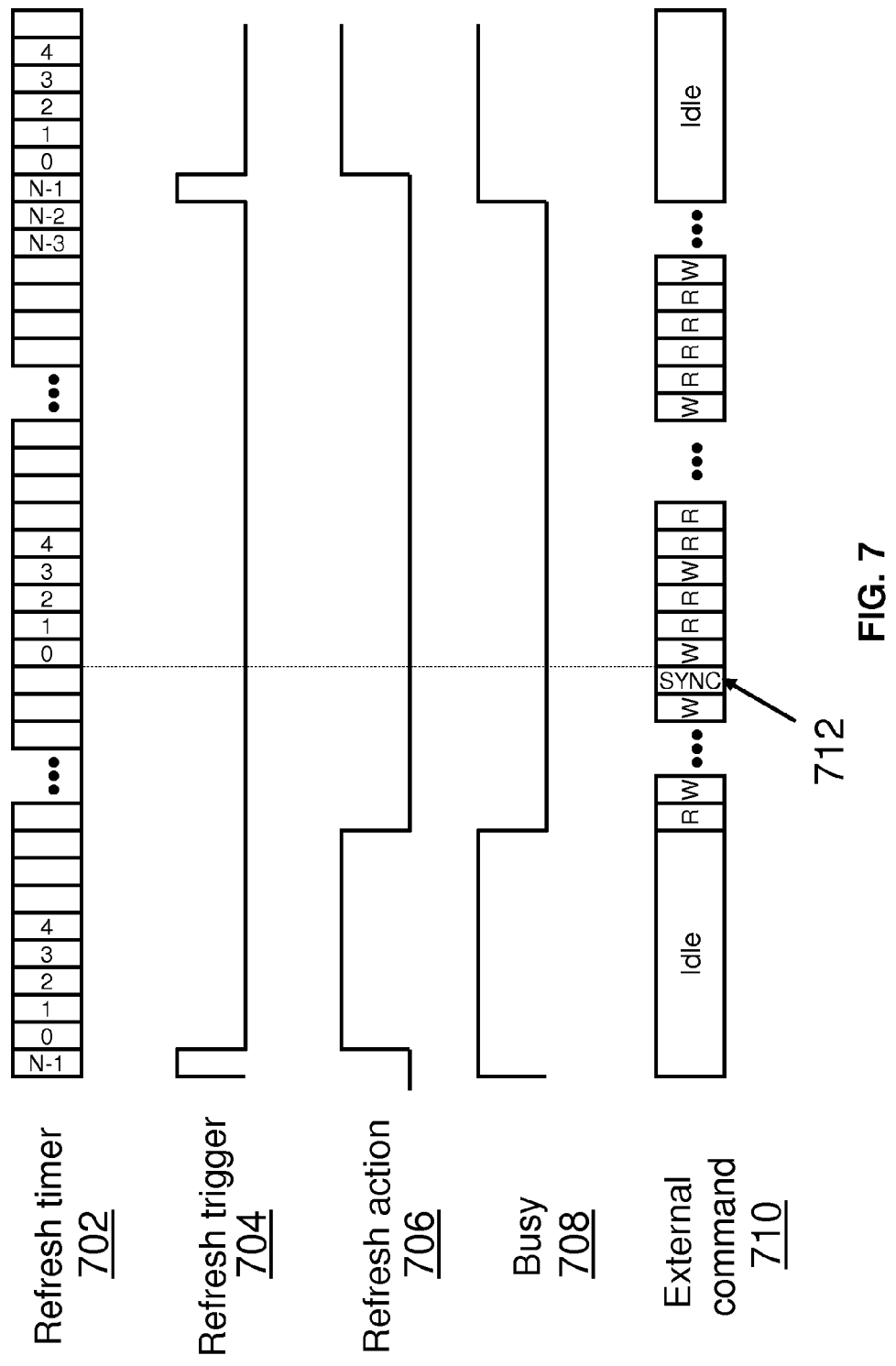
FIG. 7 illustrates an example timing diagram for the memory device of FIG. 5 when refresh synchronization is active in accordance with an embodiment.

FIG. 7 illustrates an example timing diagram for the memory device 412 of FIG. 5 when refresh synchronization is active in accordance with an embodiment. Similar to FIG. 6, the example timing diagram of FIG. 7 depicts a refresh timer sequence 702 for the internal refresh timer 504 of FIG. 5 and a refresh trigger sequence 704 initiated by the internal refresh trigger 510 when the internal refresh timer 504 reaches the predetermined value N−1. Similarly, a refresh action sequence 706, busy sequence 708, and an external command sequence 710 are also depicted in FIG. 7. As part of the external command sequence 710, a synchronization command 712 is received on the command bus 414, which resets the internal refresh timer 504 to zero prior to reaching the predetermined value. Since an initiator of the synchronization command 712, such as memory controller 402 of FIG. 4, knows when the synchronization command 712 was sent, the timing of the next internal refresh trigger 510 becomes synchronized.

Figure 8:
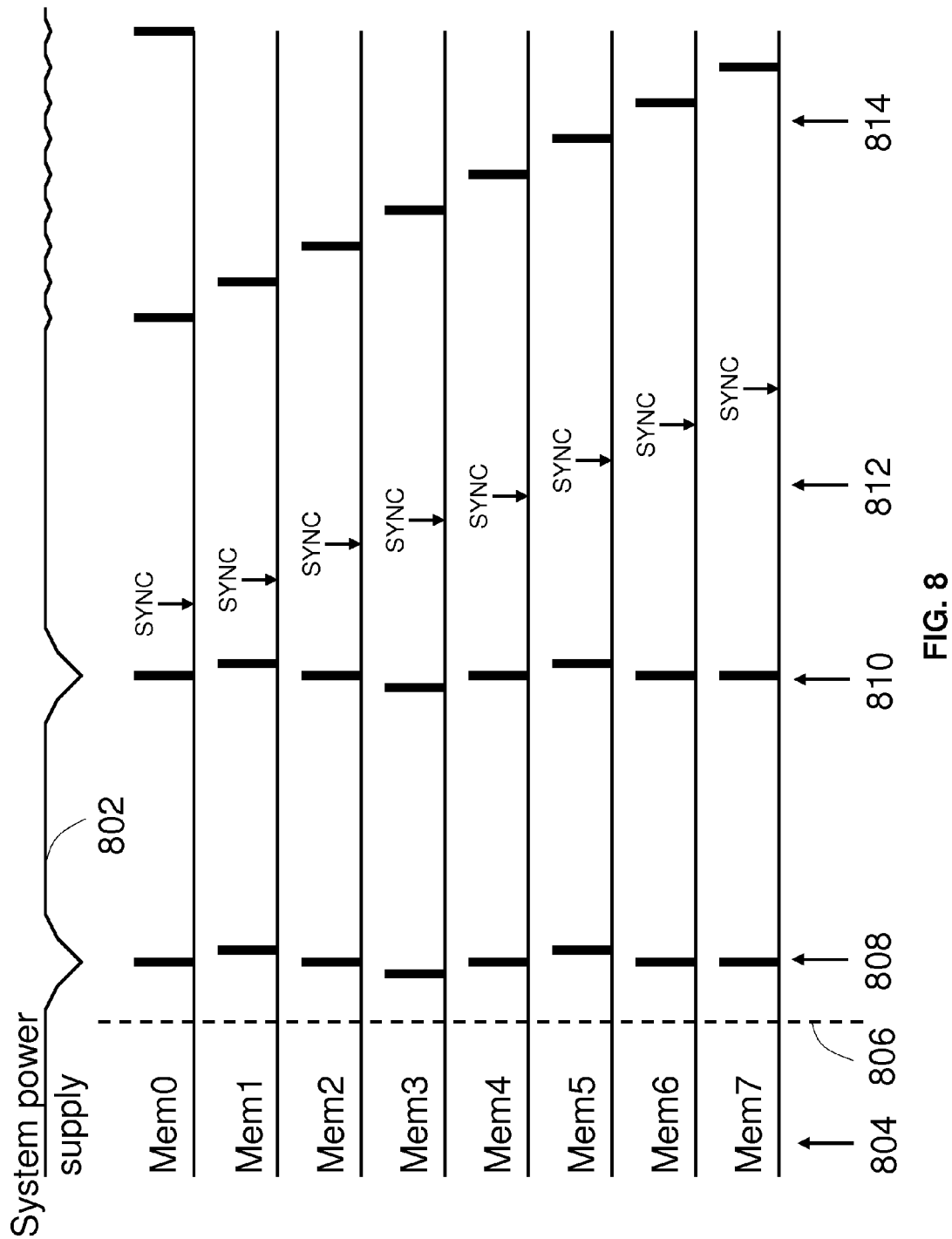
FIG. 8 illustrates an example refresh timing diagram for multiple memory devices of FIG. 5 in accordance with an embodiment.

FIG. 8 illustrates an example refresh timing diagram for multiple memory devices 412 of FIG. 5 in accordance with an embodiment. As illustrated in FIG. 7, the use of the synchronization command 712 synchronizes memory refresh. In a system that include a large number of memory devices 412, a temporary pull-down of a system power supply 802 can result if refresh actions for many memory devices 412 occur at about the same time, due to a large current demand. FIG. 8 depicts a simplified example of effects on the system power supply 802 for refreshing a group 804 of memory devices 412. The example of FIG. 8 depicts memory devices 412 labeled as Mem0-Mem7. At system power-up or reset 806, refresh actions 808 for the group 804 result in a pull-down of the system power supply 802, which can appear as power supply noise and potentially impact other system components. As the internal refresh timers 504 of each memory device 412 triggers internal refresh actions 810, the relative refresh timing is maintained and power supply pull-down also occurs again. To reduce the large pull-down effect on the system power supply 802, a group of staggered synchronization commands 812 is sent to Mem0-Mem7, resulting in staggered internal refresh actions 814. By spreading synchronization commands over a period of time, noise observed at the system power supply 802 attributable to memory refresh is spread out and reduced in amplitude.

Figure 9:
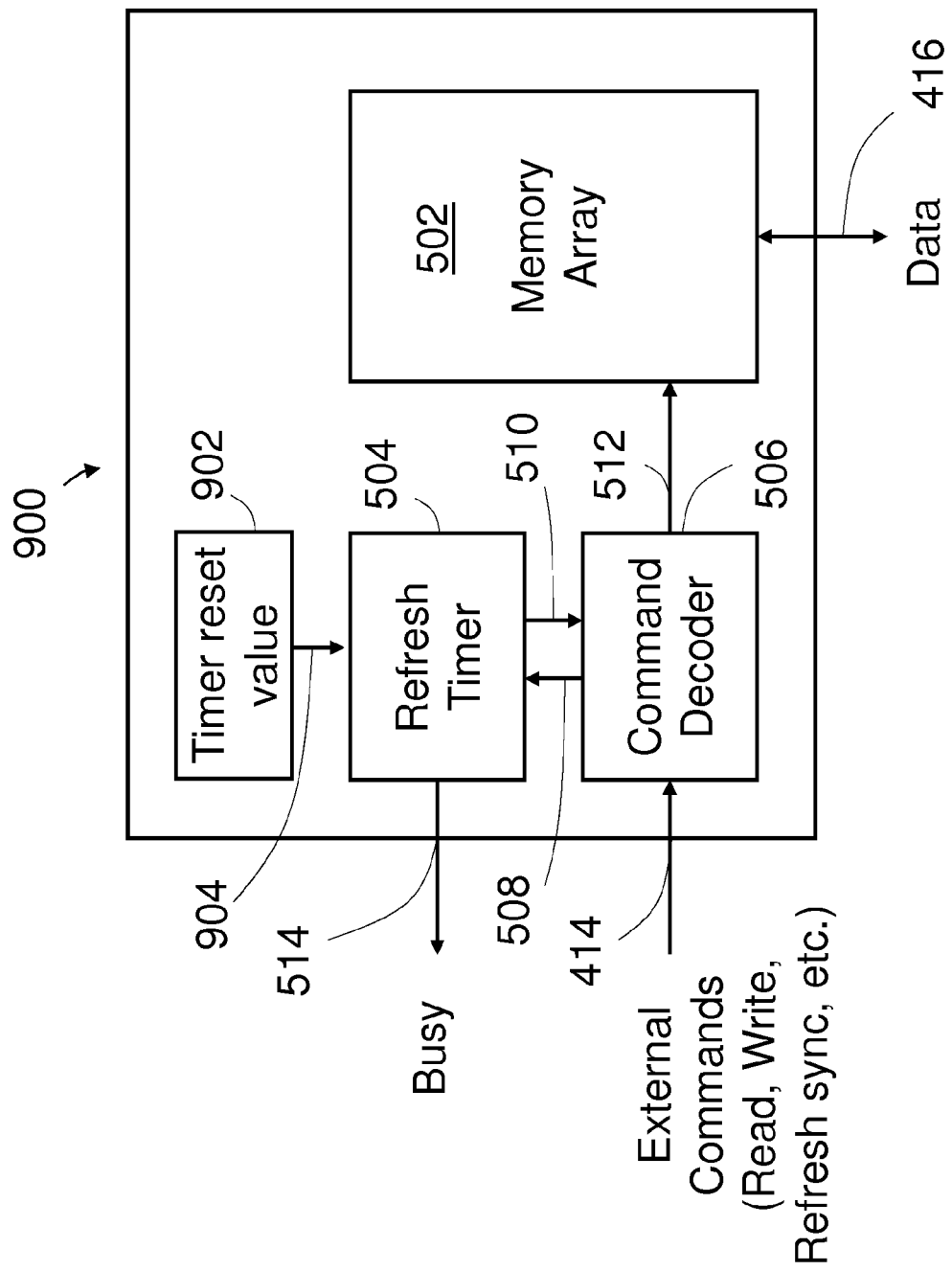
FIG. 9 illustrates a memory device in accordance with another embodiment.

FIG. 9 illustrates a memory device 900 in accordance with another embodiment. The memory device 900 of FIG. 9 is an alternate embodiment of the memory device 412 of FIG. 5, where like elements have like numbering. The memory device 900 includes a memory array 502, refresh timer 504, command decoder 506, timer reset 508, internal refresh trigger 510, internal command bus 512, and busy signal 514. The memory device 900 is configured to interface with command bus 414 and data bus 416. The memory device 900 also includes a timer reset value 902 configured to establish an initial value for the internal refresh timer 504 based on receiving a synchronization command. In an embodiment, when the internal refresh timer 504 reaches the predetermined value to trigger a refresh, the internal refresh timer 504 resets to an initial value, e.g., zero. Upon receiving a synchronization command, the timer reset value 902 is passed on a reset value bus 904 to reset the internal refresh timer 504. The value of the timer reset value 902 can be configured to a zero or a non-zero number.

Figure 10:
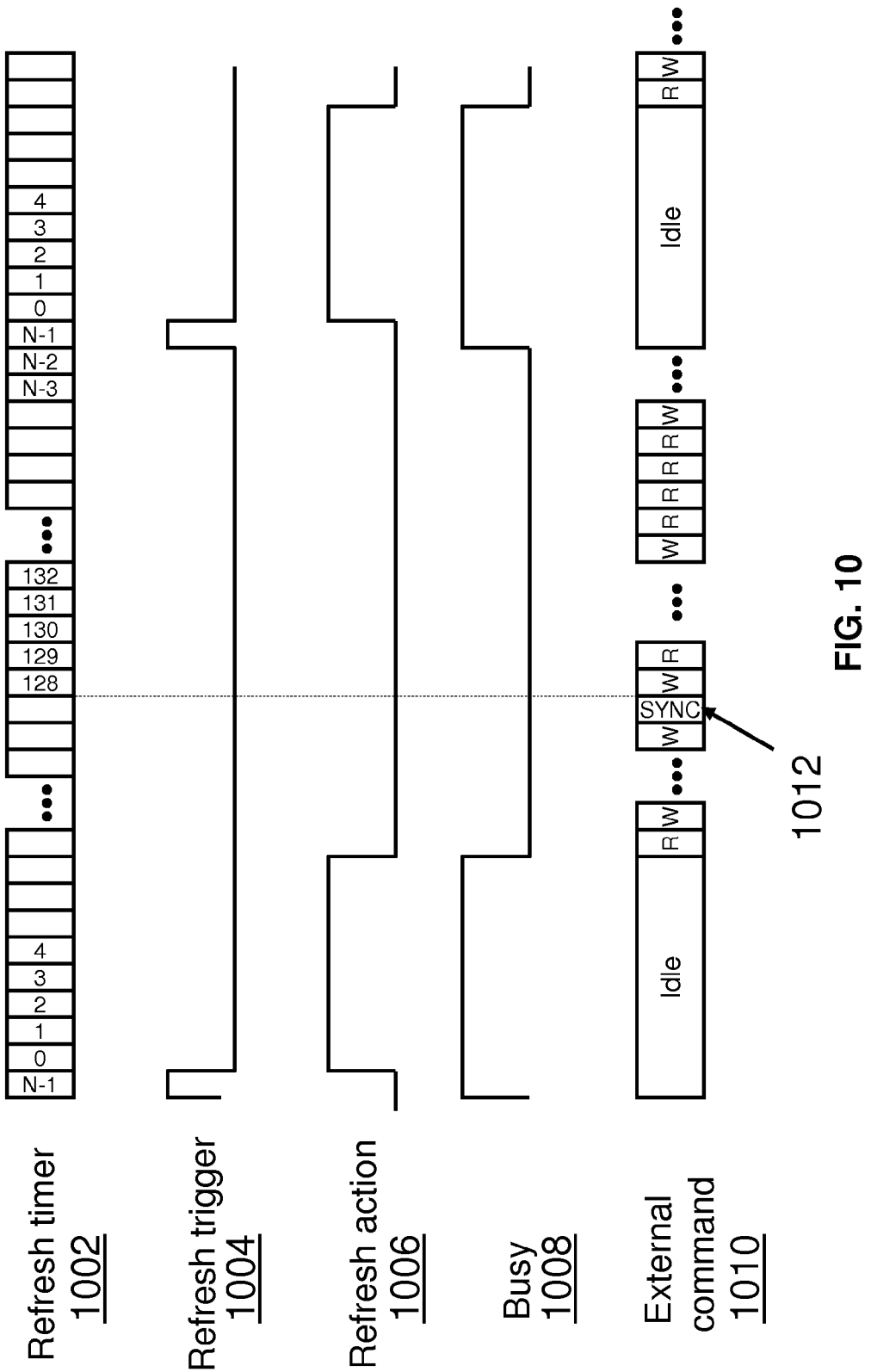
FIG. 10 illustrates an example timing diagram for the memory device of FIG. 9 when refresh synchronization is active in accordance with an embodiment.

FIG. 10 illustrates an example timing diagram for the memory device 900 of FIG. 9 when refresh synchronization is active in accordance with an embodiment. Similar to FIG. 7, the example timing diagram of FIG. 10 depicts a refresh timer sequence 1002 for the internal refresh timer 504 of FIG. 9 and a refresh trigger sequence 1004 initiated by the internal refresh trigger 510 when the internal refresh timer 504 reaches the predetermined value N−1. Similarly, a refresh action sequence 1006, busy sequence 1008, and an external command sequence 1010 are also depicted in FIG. 10. As part of the external command sequence 1010, a synchronization command 1012 is received on the command bus 414, which resets the internal refresh timer 504 to the timer reset value 902 prior to reaching the predetermined value. In the example of FIG. 10, the timer reset value 902 is set to a value of 128.

Figure 11:
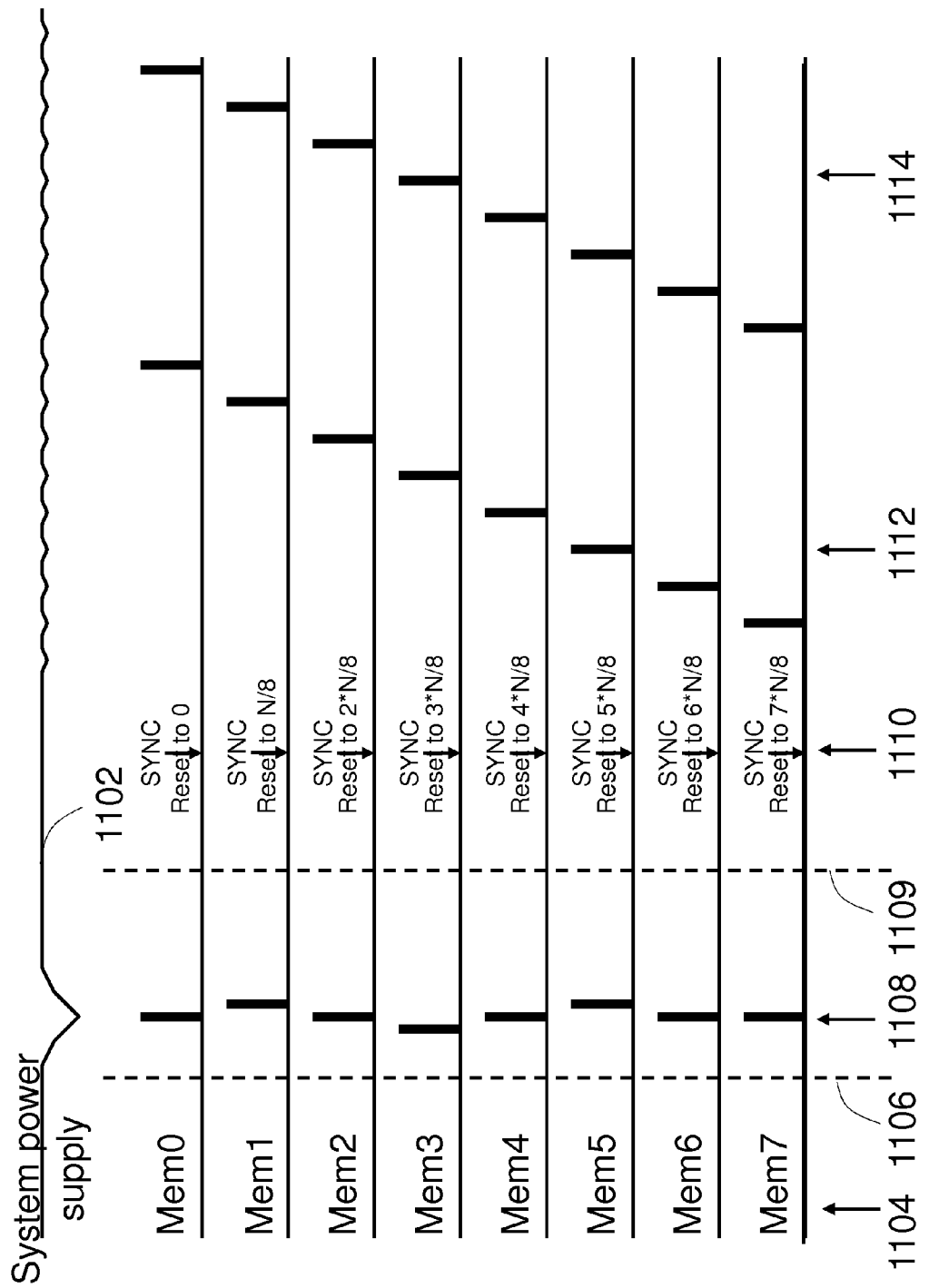
FIG. 11 illustrates an example refresh timing diagram for multiple memory devices of FIG. 9 in accordance with an embodiment.

FIG. 11 illustrates an example refresh timing diagram for multiple memory devices 900 of FIG. 9 in accordance with an embodiment. Similar to FIG. 8, FIG. 11 depicts a simplified example of effects on a system power supply 1102 for refreshing a group 1104 of memory devices 900. The example of FIG. 11 depicts memory devices 900 labeled as Mem0-Mem7. At system power-up or reset 1106, refresh actions 1108 for the group 1104 result in a pull-down of the system power supply 1102, which can appear as power supply noise and potentially impact other system components. A load command 1109 is sent to the each of the memory devices 900 to assign specific values to the timer reset values 902 in Mem0-Mem7. In the example of FIG. 11, there are eight memory devices; therefore, the values assigned to each of the timer reset values 902 are divided in increments of 1/8, such as 0, N/8, 2*N/8, 3*N/8, 4*N/8, 5*N/8, 6*N/8, and 7*N/8, where N is the number of counts per refresh period.

A synchronization command 1110 is broadcast to the group 1104 of memory devices 900. The different values stored in the timer reset values 902 in Mem0-Mem7 result in staggering of the current timer value in each of the internal refresh timers 504. As the internal refresh timers 504 of each memory device 900 triggers a group of internal refresh actions 1112, the relative refresh timing is staggered between memory devices 900. Once the internal refresh timers 504 in Mem0-Mem7 are staggered, the staggered pattern repeats as each of the internal refresh timers 504 reaches the predetermined value and resets to zero in subsequent internal refresh actions 1114. Using the timer reset values 902 takes the relative synchronization timing burden off of a memory controller and reduces the number of separate synchronization signals that must be sent in the system. By spreading the timer reset values 902 over a period of time, noise observed at the system power supply 1102 attributable to memory refresh is spread out and reduced in amplitude.

Figure 12:
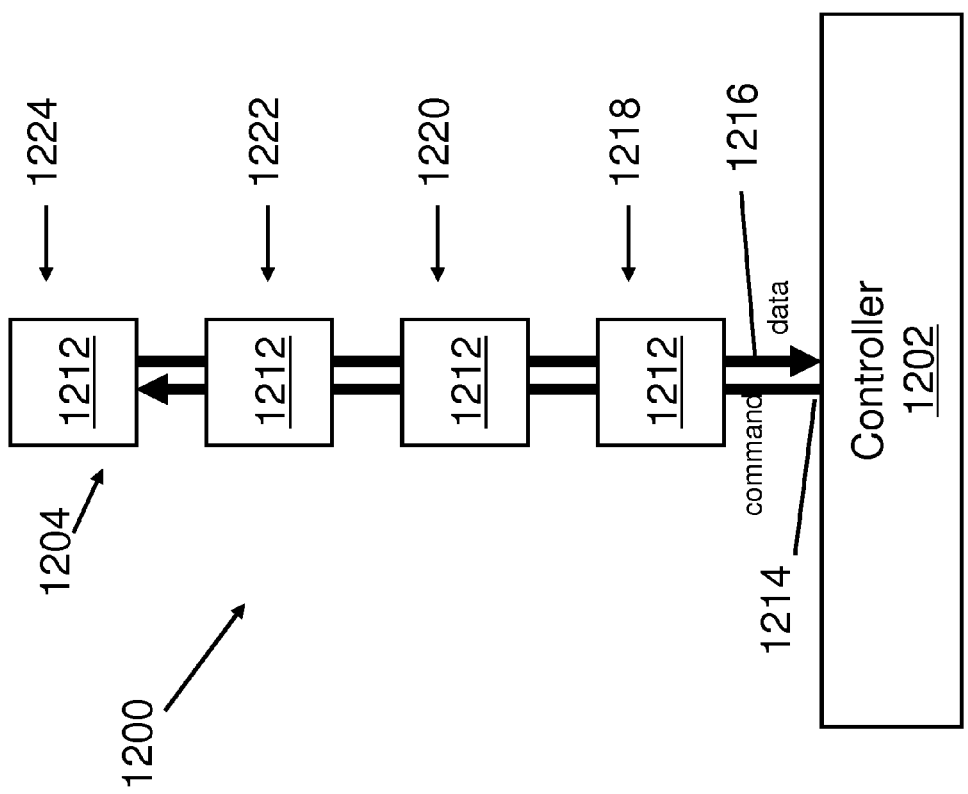
FIG. 12 illustrates a portion of a memory system of cascaded memory devices in accordance with an embodiment.

FIG. 12 illustrates a portion of a memory system 1200 of cascaded memory devices 1212 in accordance with an embodiment. The cascaded memory devices 1212 can be implemented as the memory devices 412 of FIG. 5 or the memory devices 900 of FIG. 9 with interface circuitry to support cascade interconnections. In the embodiment of FIG. 12, a single memory column 1204 is depicted that includes four cascaded memory devices 1212 for purposes of explanation. The memory system 1200 also includes a memory controller 1202, command bus 1214, and data bus 1216. The command bus 1214 and data bus 1216 are configured to send and receive commands, status, and data between the memory controller 1202 and the cascaded memory devices 1212.

The memory controller 1202 directly interfaces with the cascaded memory device 1212 at a first position 1218 that is closest to the memory controller 1202. The cascaded memory device 1212 at the first position 1218 interfaces with the cascaded memory device 1212 at a second position 1220, which in turn interfaces with the cascaded memory device 1212 at a third position 1222. The cascaded memory device 1212 at the third position 1222 interfaces with the cascaded memory device 1212 at a fourth position 1224. A command propagation delay (tCPD) is a delay time to propagate commands between each position. This command propagation delay must be accounted for when sending synchronization commands or programming a timer reset value in each of the cascaded memory devices 1212.

Although the command and data buses 1214 and 1216 are depicted in FIG. 12 with unidirectional arrows, it will be understood that they can include any number of unidirectional and/or bidirectional signals, including status signals (not depicted). Additionally, the number of memory columns and cascaded memory devices 1212 depicted in FIG. 12 is merely for example purposes, as the memory system 1200 can include any number of memory columns and cascaded memory devices 1212 per memory column. The memory system 1200 can be part of an active memory cube or can be organized in conventional configurations, such as a memory module or planar configuration.

Figure 13:
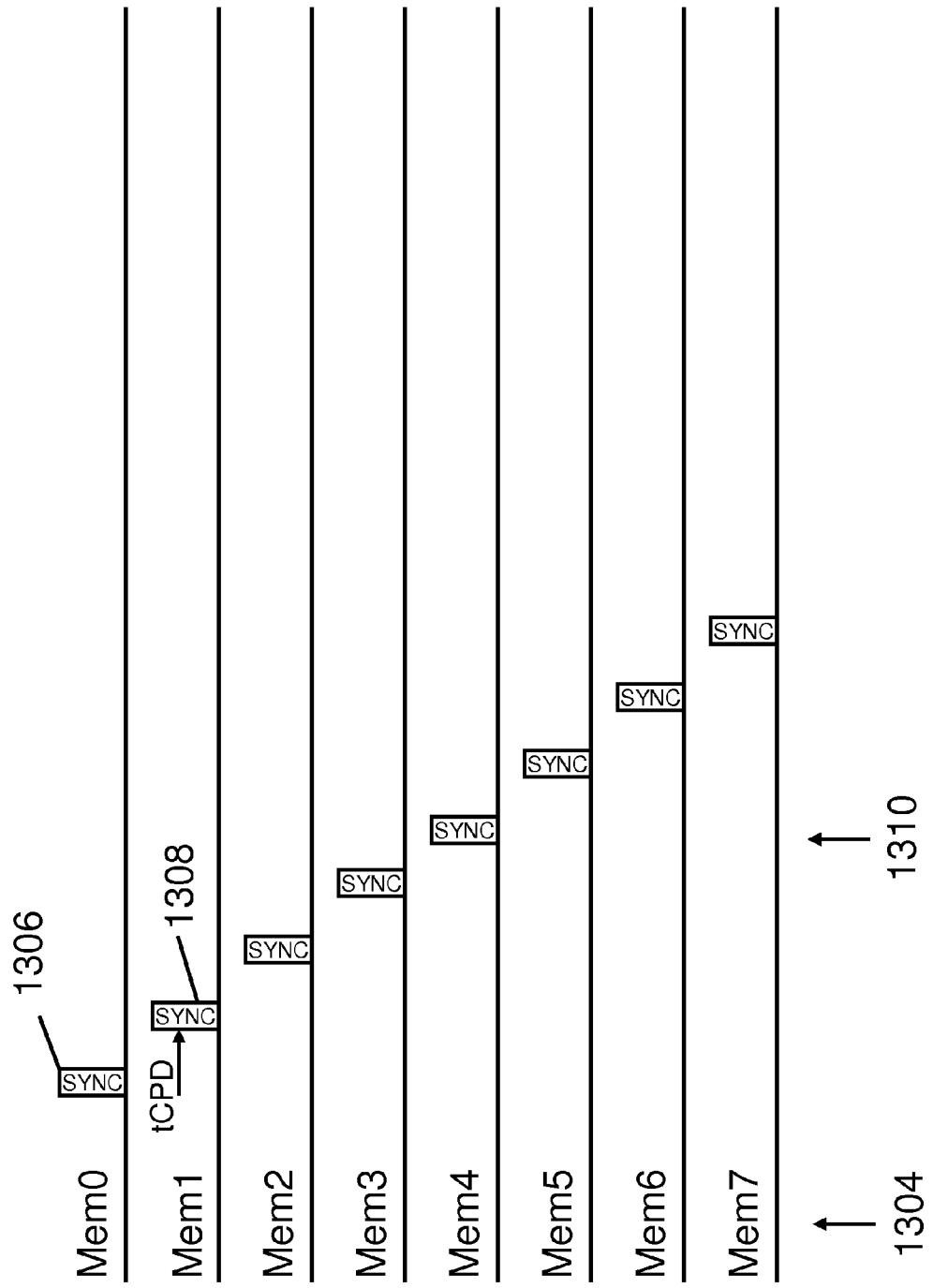
FIG. 13 illustrates an example timing diagram of refresh synchronization in a memory system of cascaded memory devices in accordance with an embodiment.

FIG. 13 illustrates an example timing diagram of refresh synchronization in a memory system of cascaded memory devices 1212 of FIG. 12 in accordance with an embodiment. FIG. 13 depicts a group 1304 of cascaded memory devices 1212 labeled as Mem0-Mem7, where Mem0 is at the first position 1218. Mem0 receives synchronization command 1306 from the memory controller 1202 and propagates it as a time delayed synchronization command 1308 to Mem1 at the second position 1220. A command propagation delay (tCPD) exists between the synchronization command 1306 and the time delayed synchronization command 1308, as well as between each of Mem1-Mem7, resulting in staggered synchronization commands 1310. When the cascaded memory devices 1212 include timer reset values, similar to the timer reset values 902 of FIG. 9, they can be programmed to account for tCPD. In an embodiment of FIG. 13, Mem0 has a timer reset value of 0*N/8+7*tCPD, Mem1 has a timer reset value of 1*N/8+6*tCPD, Mem2 has a timer reset value of 2*N/8+5*tCPD, Mem3 has a timer reset value of 3*N/8+4*tCPD, Mem4 has a timer reset value of 4*N/8+3*tCPD, Mem5 has a timer reset value of 5*N/8+2*tCPD, Mem6 has a timer reset value of 6*N/8+1*tCPD, and Mem7 has a timer reset value of 7*N/8+0*tCPD.

Figure 14:
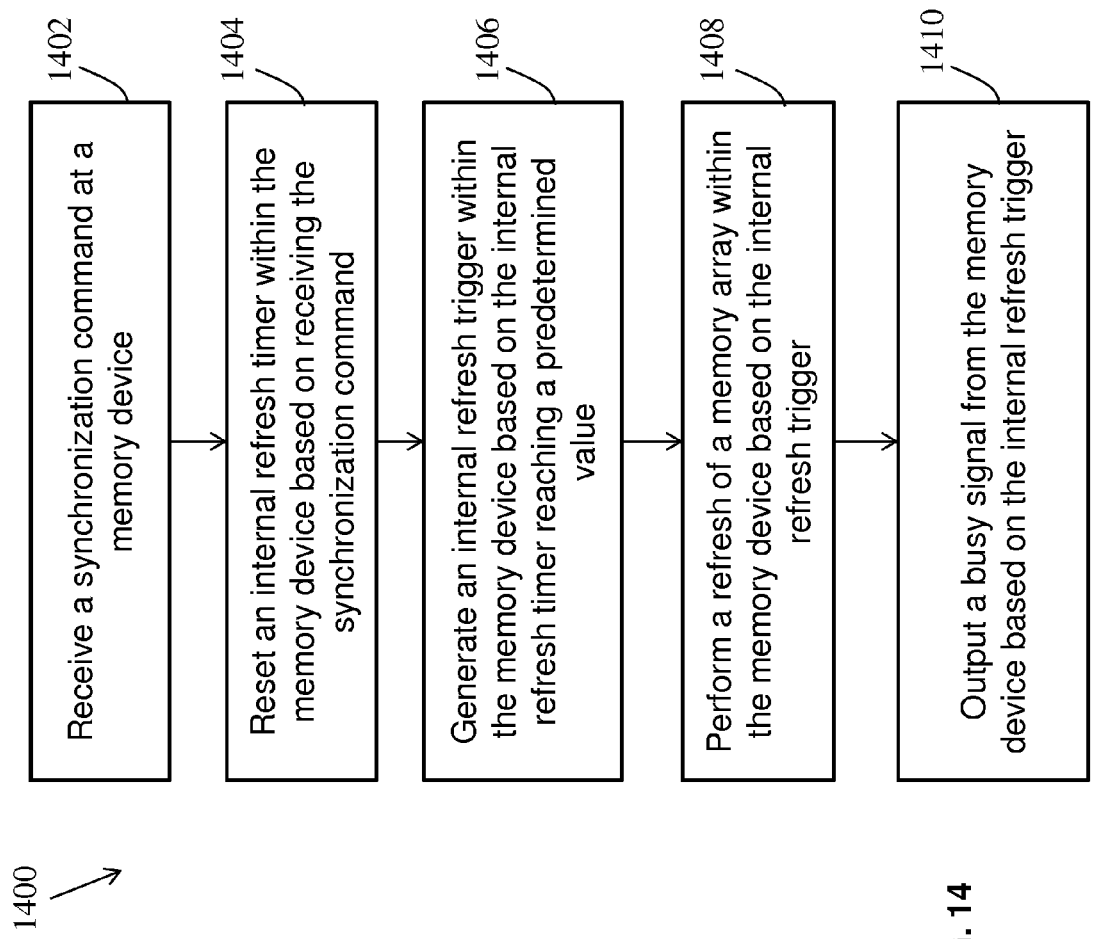
FIG. 14 illustrates a flow diagram of a process for refreshing memory in accordance with an embodiment.

FIG. 14 is a process 1400 for refreshing memory in a memory system. The memory system may be an active memory device, such as a three-dimensional memory cube with memory divided into three-dimensional blocked regions as memory vaults, such as the active memory devices of FIGS. 1-3. It will also be understood that the process 1400 can be implemented in other types of processing circuits and systems other than active memory devices.

To reset an internal refresh timer of a memory device in a memory system before reaching a predetermined value, a memory controller sends a synchronization command to the memory device. At block 1402, the synchronization command is received at the memory device, such as memory device 412 of FIGS. 4 and 5, memory device 900 of FIG. 9, or cascaded memory device 1212 of FIG. 12. At block 1404, an internal refresh timer 504 within the memory device is reset based on receiving the synchronization command. In the embodiment of FIG. 9, the internal refresh timer 504 within the memory device 900 is reset to a timer reset value 902 stored within the memory device 900, where the timer reset value 902 within the memory device 900 can be loaded based on an external command.

At block 1406, an internal refresh trigger 510 within the memory device is generated based on the internal refresh timer 504 reaching a predetermined value. At block 1408, a refresh of a memory array 502 within the memory device is performed based on the internal refresh trigger 510. At block 1410, a busy signal 514 can be output from the memory device based on the internal refresh trigger 510. The busy signal 514 may be output until completion of the refresh of the memory array 502 within the memory device.

A second synchronization command can be sent to a second memory device from the memory controller or cascaded through a memory device. The second memory device includes a second internal refresh timer and a second memory array. Timing of sending the synchronization command to the memory device and sending the second synchronization command to the second memory device is staggered, such that a first time to refresh the memory array within the memory device does not overlap a second time to refresh the second memory array within the second memory device.

The second internal refresh timer within the second memory device can be reset to a second timer reset value stored within the second memory device. A second internal refresh trigger is generated within the second memory device based on the second internal refresh timer reaching the predetermined value. A refresh of the second memory array is performed within the second memory device based on the second internal refresh trigger. The synchronization command and the second synchronization command can be a common synchronization broadcast to both the memory device and the second memory device. The timer reset value and the second timer reset value can be configured such that a first time to refresh the memory array within the memory device does not overlap a second time to refresh the second memory array within the second memory device.

In an embodiment, such as the embodiment of FIG. 13, the memory device is cascade connected to the second memory device. A timer reset value can be loaded within the memory device, and a second timer reset value can be loaded within the second memory device. The second synchronization command is sent from the memory device to the second memory device based on receiving the synchronization command at the memory device. The internal refresh timer within the memory device is reset to the timer reset value stored within the memory device based on receiving the synchronization command. The second internal refresh timer within the second memory device is reset to the second timer reset value stored within the second memory device. The timer reset value and the second timer reset value are configured such that a first time to refresh the memory array within the memory device does not overlap a second time to refresh the second memory array within the second memory device, including accounting for command propagation delays between the memory device and the second memory device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for refreshing memory, the method comprising:
   receiving a synchronization command at a memory device;
   resetting an internal refresh timer in value based on receiving the synchronization command, the internal refresh timer located within the memory device;
   generating an internal refresh trigger within the memory device based on the internal refresh timer reaching a predetermined value;
   outputting a busy signal from the memory device based on the internal refresh trigger;
   performing a refresh of a memory array within the memory device based on the internal refresh trigger; and
   outputting the busy signal until completion of the refresh of the memory array within the memory device.

2. The method of claim 1, further comprising:
   resetting the internal refresh timer within the memory device to a timer reset value stored within the memory device.

3. The method of claim 2, further comprising:
   loading the timer reset value within the memory device based on an external command.

4. The method of claim 1, further comprising:
   sending the synchronization command from a memory controller to the memory device; and
   sending a second synchronization command to a second memory device, the second memory device comprising a second internal refresh timer and a second memory array.

5. The method of claim 4, further comprising:
   staggering timing of sending the synchronization command to the memory device and sending the second synchronization command to the second memory device, such that a first time to refresh the memory array within the memory device does not overlap a second time to refresh the second memory array within the second memory device.

6. The method of claim 4, further comprising:
   resetting the internal refresh timer within the memory device to a timer reset value stored within the memory device;
   resetting the second internal refresh timer within the second memory device to a second timer reset value stored within the second memory device;
   generating a second internal refresh trigger within the second memory device based on the second internal refresh timer reaching the predetermined value; and
   performing a refresh of the second memory array within the second memory device based on the second internal refresh trigger, wherein the synchronization command and the second synchronization command are a common synchronization broadcast to both the memory device and the second memory device, and the timer reset value and the second timer reset value are configured such that a first time to refresh the memory array within the memory device does not overlap a second time to refresh the second memory array within the second memory device.

7. The method of claim 4, wherein the memory device is cascade connected to the second memory device, and further comprising:
   loading a timer reset value within the memory device;
   loading a second timer reset value within the second memory device;
   sending the second synchronization command from the memory device to the second memory device based on receiving the synchronization command at the memory device;
   resetting the internal refresh timer within the memory device to the timer reset value stored within the memory device based on receiving the synchronization command; and
   resetting the second internal refresh timer within the second memory device to the second timer reset value stored within the second memory device, wherein the timer reset value and the second timer reset value are configured such that a first time to refresh the memory array within the memory device does not overlap a second time to refresh the second memory array within the second memory device, including accounting for command propagation delays between the memory device and the second memory device.

8. A memory system, comprising:
   a memory controller; and
   a plurality of memory devices interfaced to the memory controller, each of the memory devices comprising:
     a command decoder configured to receive a synchronization command;
     an internal refresh timer configured to reset in value based on receiving the synchronization command and to generate an internal refresh trigger based on the internal refresh timer reaching a predetermined value; and
     a memory array configured to refresh based on the internal refresh trigger after receiving the synchronization command, wherein the internal refresh timer is further configured to output a busy signal from the memory device based on the internal refresh trigger until completion of the refresh of the memory array.

9. The memory system of claim 8, wherein the internal refresh timer is further configured to send the internal refresh trigger to the command decoder; and the command decoder is further configured to refresh the memory array based on the internal refresh trigger.

10. The memory system of claim 8, wherein the memory controller is configured to stagger timing of sending the synchronization command to the memory devices, such that refresh times of each of the memory devices do not overlap.

11. The memory system of claim 8, wherein each of the memory devices further comprises a timer reset value; the internal refresh timer is further configured to be reset to the timer reset value based on receiving the synchronization command; and the command decoder is further configured to load the timer reset value based on a command from the memory controller.

12. The memory system of claim 11, wherein the memory controller is configured to send the synchronization command to the memory devices as a common synchronization broadcast, and the timer reset value of each of the memory devices is configured such that refresh times of each of the memory devices do not overlap.

13. The memory system of 11, wherein the memory devices are cascade interconnected, and a first memory device of the memory devices is coupled to the memory controller and configured to propagate the synchronization command from the memory controller to a second memory device of the memory devices, and further wherein timer reset values of the first and second memory devices are configured such that a first time to refresh the first memory device does not overlap a second time to refresh the second memory device, including accounting for command propagation delays between the first memory device and the second memory device.

14. The memory system of claim 8, wherein the memory system is an active memory device configured as a three-dimensional memory cube, and the plurality of memory devices are divided into three-dimensional blocked regions as memory vaults.

15. A memory device, comprising:
a command decoder configured to receive a synchronization command;
an internal refresh timer configured to reset in value based on receiving the synchronization command and to generate an internal refresh trigger based on the internal refresh timer reaching a predetermined value; and
a memory array configured to refresh based on the internal refresh trigger, wherein the internal refresh timer is further configured to output a busy signal from the memory device based on the internal refresh trigger until completion of the refresh of the memory array.

16. The memory device of claim 15, wherein the internal refresh timer is further configured to send the internal refresh trigger to the command decoder; and the command decoder is further configured to refresh the memory array based on the internal refresh trigger.

17. The memory device of claim 15, further comprising a timer reset value, wherein the internal refresh timer is further configured to be reset to the timer reset value based on receiving the synchronization command.

18. The memory device of claim 17, wherein the command decoder is further configured to load the timer reset value based on an external command.

19. The memory device of claim 15, wherein the memory device is configured to be cascade interconnected to one or more other memory devices, and to propagate the synchronization command received at the memory device to the one or more other memory devices.

* * * * *